US008299522B2

(12) United States Patent
Iwamuro

(10) Patent No.: US 8,299,522 B2
(45) Date of Patent: Oct. 30, 2012

(54) SEMICONDUCTOR DEVICE

(75) Inventor: Noriyuki Iwamuro, Matsumoto (JP)

(73) Assignee: Fuji Electric Co., Ltd. (JP)

(*) Notice: Subject to any disclaimer, the term of this patent is extended or adjusted under 35 U.S.C. 154(b) by 0 days.

(21) Appl. No.: 13/049,463

(22) Filed: Mar. 16, 2011

(65) Prior Publication Data

US 2011/0163372 A1 Jul. 7, 2011

Related U.S. Application Data

(62) Division of application No. 12/240,564, filed on Sep. 29, 2008, now Pat. No. 7,932,559.

(30) Foreign Application Priority Data

Sep. 28, 2007 (JP) ................................. 2007-254636

(51) Int. Cl.
H01L 29/66 (2006.01)
(52) U.S. Cl. .......... 257/328; 257/E29.257; 257/E27.033
(58) Field of Classification Search .................. 257/328,
257/330, 511, 373, 374, 343, 270, 329, 401,
257/E29.201, E29.26, E29.04, E29.257, E27.031,
257/E27.032, E27.033
See application file for complete search history.

(56) References Cited

U.S. PATENT DOCUMENTS

| | | | |
|---|---|---|---|
| 5,304,821 A | 4/1994 | Hagino | |
| 5,525,821 A | 6/1996 | Harada et al. | |
| 6,097,063 A | 8/2000 | Fujihira | |
| 6,211,549 B1 * | 4/2001 | Funaki et al. | 257/329 |
| 6,348,716 B1 * | 2/2002 | Yun | 257/356 |
| 6,413,822 B2 * | 7/2002 | Williams et al. | 438/270 |
| 6,670,658 B2 * | 12/2003 | Hattori et al. | 257/279 |
| 6,765,262 B2 * | 7/2004 | Ahlers et al. | 257/328 |
| 7,002,211 B2 | 2/2006 | Onishi et al. | |
| 7,126,166 B2 * | 10/2006 | Nair et al. | 257/110 |
| 7,470,960 B1 * | 12/2008 | Sugawara | 257/401 |
| 7,511,357 B2 * | 3/2009 | Hshieh | 257/551 |
| 7,910,985 B2 * | 3/2011 | Inagawa et al. | 257/328 |
| 7,911,023 B2 * | 3/2011 | Akagi et al. | 257/511 |

(Continued)

FOREIGN PATENT DOCUMENTS

JP 04-146674 A 5/1992

(Continued)

OTHER PUBLICATIONS

Takeuchi et al., "Intelligent Power Switches for Automotive Ignition", Fuji Electric Journal, pp. 164-167, vol. 72 No. 3, 1999; English abstract provided.

Primary Examiner — Matthew Landau
Assistant Examiner — Latanya N Crawford
(74) Attorney, Agent, or Firm — Rossi, Kimms & McDowell LLP

(57) ABSTRACT

A super-junction semiconductor substrate is configured in such a manner that an n-type semiconductor layer of a parallel pn structure is opposed to a boundary region between an active area and a peripheral breakdown-resistant structure area. A high-concentration region is formed at the center between p-type semiconductor layers that are located on both sides of the above n-type semiconductor layer. A region where a source electrode is in contact with a channel layer is formed over the n-type semiconductor layer. A portion where the high-concentration region is in contact with the channel layer functions as a diode. The breakdown voltage of the diode is set lower than that of the device.

4 Claims, 20 Drawing Sheets

U.S. PATENT DOCUMENTS

| | | | |
|---|---|---|---|
| 7,943,991 B2 * | 5/2011 | Yoshikawa | 257/330 |
| 2002/0088991 A1 * | 7/2002 | Hisamoto | 257/172 |
| 2002/0167020 A1 | 11/2002 | Iwamoto et al. | |
| 2004/0135228 A1 | 7/2004 | Iwamoto et al. | |
| 2005/0098826 A1 | 5/2005 | Yamaguchi et al. | |
| 2006/0157813 A1 * | 7/2006 | Saito et al. | 257/498 |
| 2007/0249142 A1 * | 10/2007 | Hisanaga | 438/459 |
| 2007/0290267 A1 | 12/2007 | Yoshikawa et al. | |
| 2009/0085100 A1 * | 4/2009 | Iwamuro | 257/328 |
| 2009/0114985 A1 * | 5/2009 | Akagi et al. | 257/334 |
| 2009/0212354 A1 * | 8/2009 | Hsieh | 257/328 |
| 2009/0236697 A1 | 9/2009 | Ono et al. | |
| 2010/0032752 A1 | 2/2010 | Hozumi et al. | |

FOREIGN PATENT DOCUMENTS

| | | |
|---|---|---|
| JP | 04-233765 A | 8/1992 |
| JP | 05-335582 A | 12/1993 |
| JP | 09-266311 A | 10/1997 |
| JP | 2004-119611 A | 4/2004 |
| JP | 2005-051190 A | 2/2005 |
| JP | 2006-313892 A | 11/2006 |

* cited by examiner

| INTERVAL BETWEEN P-TYPE LAYERS (μm) | BREAKDOWN VOLTAGE (V) |
|---|---|
| 3 | 715 |
| 4 | 778 |
| 5 | 779 |
| 6 | 778 |
| 7 | 778 |
| 8 | 776 |
| 10 | 770 |
| 12 | 770 |
| 13 | 688 |
| 14 | 640 |
| 16 | 582 |
| 20 | 450 |

SEMICONDUCTOR DEVICE

CROSS REFERENCE TO RELATED APPLICATION

This is a divisional of and claims priority from U.S. patent application Ser. No. 12/240,564 filed Sep. 29, 2008, the content of which is incorporated herein by reference.

BACKGROUND OF THE INVENTION

The present invention relates to a high-power vertical semiconductor device and, more particularly, to a semiconductor device having a super-junction layer as part of a semiconductor substrate.

To miniaturize and enhance the performance of power source apparatus in the power electronics field, power semiconductor devices are required to be reduced in loss and increased in breakdown resistance and operation speed as well as increased in breakdown voltage and current capacity. To satisfy these requirements, the super-junction substrate has been proposed as a substrate structure of a semiconductor device and the vertical MOS power device structure has been proposed as a surface structure.

For purposes of this discussion, the terms "n-type semiconductor" and "p-type semiconductor" mean semiconductors having electrons and holes, respectively, as majority carriers. The marks "+" and "−" of $n^+$, $n^-$, etc. will refer to the impurity concentration of the semiconductor concerned is higher and lower, respectively, than that of a semiconductor that is not given either of those marks.

The semiconductor substrate having a single conductivity type and the super-junction substrate are commonly known substrate structures of a semiconductor device. The super-junction substrate has, between a first conductivity type semiconductor substrate and a second conductivity type semiconductor layer, a super-junction layer in which first conductivity type semiconductor layers and second conductivity type semiconductor layers are formed alternately in the direction that is perpendicular to the semiconductor substrate (refer to U.S. Pat. No. 6,097,063 (JP-A-9-266311) and U.S. Pat. No. 6,888,195 B2 (JP-A-2004-119611), for example). In the super-junction substrate, a space charge region can develop to occupy the super-junction layer in an off period even in the case where concentration of each of the layers constituting the super-junction layer is high. Therefore, the on-resistance of a high-breakdown-voltage semiconductor device, in particular, can be reduced.

The planar structure in which a gate electrode is formed on a semiconductor substrate and the trench structure in which gate electrodes are buried in trenches of a semiconductor substrate are commonly known surface structures of a semiconductor device. Trench MOS devices have a trench gate structure in which many trench MOS cells having trench side walls as channel regions are provided in a semiconductor substrate. In general, trench MOS devices are easier to improve in performance than planar MOS devices by reducing the channel resistance. In recent years, as for vertical devices, vertical MOS devices having the trench structure have been proposed because they are easier to attain a low-on-resistance characteristic by virtue of their structure (refer to JP-A-4-233765, U.S. Pat. No. 5,304,821 A (JP-A-146674), and JP-A-5-335582, for example).

An example of such vertical MOS devices will be described below. FIG. 25 is a sectional view showing the structure of a conventional vertical MOS device. As shown in FIG. 25, this conventional vertical MOS device is manufactured by using a semiconductor substrate in which an $n^+$ drain layer 30, an $n^-$ drain layer 31, and a $p^-$ channel region 32 are laid one on another in this order. Many trenches 33 penetrate through the $p^-$ channel region 32 so as to reach the $n^-$ drain layer 31. Gate electrodes 35 made of polysilicon or the like are formed on the surfaces of the trenches 33 with gate oxide films 34 interposed in between, respectively. $P^+$ body regions 37 are formed on the surface of the $p^-$ channel region 32 approximately at the centers between the trenches 33. And $n^{++}$ source regions 36 are formed so as to be in contact with the $p^+$ body regions 37 and the trenches 33. A metal electrode 39 made of aluminum or the like is formed on the gate electrodes 35 with an insulating layer 38 interposed in between. The metal electrode 39 is in ohmic contact with the $p^+$ body regions 37 and the $n^{++}$ source regions 36.

In this vertical MOSFET, when a voltage that is higher than a prescribed threshold voltage is applied to the gate electrodes 35, n-type inversion layers are formed in the $p^-$ channel region 32 parallel with the trenches 33 and current paths are formed between the $n^{++}$ source regions 36 and the drain layers 31 and 30. As a result, a conductive state is established between the source and the drain of the vertical MOSFET. When the voltage of the gate electrodes 35 is made lower than the threshold voltage, the n-type inversion layers in the $p^-$ channel region 32 disappear and a cutoff state is established between the source and the drain of the vertical MOSFET. In vertical MOSFETs, since as described above vertical current paths are formed parallel with the trenches 33, the current path length (in the $n^-$ drain layer 31) can be made much shorter and hence the on-resistance can be made lower than in planar MOSFETs.

Vertical MOSFETs, however, have a problem that the device is destroyed if a high voltage is applied between the source and the drain in a gate off state and avalanche current starts to flow. As a result, the device is prone to be destroyed also when it is turned off from a current conduction state. This is a major obstruction to expansion of uses.

FIG. 26 is a sectional view of part of a conventional super-junction substrate and shows its structure. That is, FIG. 26 shows part of a super-junction substrate that is cut out along lines C-C' and D-D' and the super-junction substrate is such that the structures each shown in FIG. 26 are arranged in the right-left direction. FIG. 27 is a graph showing an electric field profile along the cutting line C-C' in FIG. 26. In a vertical MOSFET using this super-junction substrate, when a high voltage is applied between the source and the drain, a depletion layer develops over the entire super-junction region and a voltage is held there. In this case, an approximately rectangular electric field profile is obtained as indicated by a solid line in FIG. 27. When avalanche current starts to flow, the current profile changes to one indicated by a broken line. It is seen that the voltage held which is an electric field integration value is made smaller. This is a negative resistance characteristic and is considered due to the structure of the super-junction substrate. As a result, current is concentrated in part of the device and the device is destroyed.

A semiconductor device capable of securing a high device breakdown voltage has been proposed in which the pn repetition pitch of a parallel pn structure in an inactive area is set smaller than that of a parallel pn structure in an active area on a first major surface side in which a device surface structure is formed and is set the same as that of the latter on a second major surface side (refer to JP-A-2005-51190, for example). In this semiconductor device, a depletion layer is apt to develop and reduction in breakdown voltage due to charge imbalance can be suppressed. As a result, a sufficiently high breakdown voltage can be secured in a well-balanced manner in the entire device.

In the technique disclosed in JP-A-2005-51190, however, a problem remains that the device is destroyed when large current such as avalanche current flows. The complex structure that the pn repetition pitch of the parallel pn structure in the inactive region on the first major surface side needs to be set different from that on the second major surface side leads to another problem that manufacture of a super-junction substrate takes extra time and work.

SUMMARY OF THE INVENTION

The present invention has been made to solve the above problems, and provides a semiconductor device which uses a super-junction semiconductor substrate and which is simple in structure, low in on-resistance, and high in avalanche breakdown resistance.

According to a first aspect of the invention, a semiconductor device is provided that includes a high-impurity-concentration semiconductor substrate of a first conductivity type; a parallel pn structure which is formed on the semiconductor substrate and in which regions of the first conductivity type and regions of a second conductivity type are arranged alternately and joined to each other; a channel region of the second conductivity type which is formed on part of a surface of the parallel pn structure; source regions of the first conductivity type which occupy surface portions of the channel region; trenches which are adjacent to the source regions and penetrate through the channel region so as to reach the parallel pn structure; gate electrodes which are formed on surfaces of the trenches with gate oxide films interposed in between; an insulating layer formed on surfaces of the gate electrodes; a source electrode which is formed on part of a surface of the insulating layer and is in contact with surfaces of the channel region and the source regions; a high-concentration region of the first conductivity type which is formed at the center of a surface of one region of the first conductivity type of the parallel pn structure and is low in breakdown voltage than an active area, the high-concentration region being formed in a region located under a gate pad or in a boundary region between the active area and an inactive area that is located outside the active area; and an opening which is formed over the one region of the first conductivity type so as to penetrate through the insulating layer and to reach the channel region, and through which the source electrode is in contact with the channel region.

A second aspect of the invention provides a semiconductor device that includes a high-impurity-concentration semiconductor substrate of a first conductivity type; a parallel pn structure which is formed on the semiconductor substrate and in which regions of the first conductivity type and regions of a second conductivity type are arranged alternately and joined to each other; a channel region of the second conductivity type which is formed on part of a surface of the parallel pn structure; a source region of the first conductivity type which occupies a surface portion of the channel region; a gate electrode which is formed on a surface of the parallel pn structure with a gate oxide film interposed in between so as to be in contact with the source region and the channel region; an insulating layer formed on a surface of the gate electrode; a source electrode which is formed on part of a surface of the insulating layer and is in contact with surfaces of the channel region and the source region; a high-concentration region of the first conductivity type which is formed at the center of a surface of one region of the first conductivity type of the parallel pn structure and is low in breakdown voltage than an active area, the high-concentration region being formed in a region located under a gate pad or in a boundary region between the active area and an inactive area that is located outside the active area; and an opening which is formed over the one region of the first conductivity type so as to penetrate through the insulating layer and to reach the channel region, and through which the source electrode is in contact with the channel region.

The width of the one region of the first conductivity type may be greater than or equal to the width of the other regions of the first conductivity type of the parallel pn structure and smaller than or equal to three times the width of the other regions of the first conductivity type.

Each of the regions of the first conductivity type may comprise a first drift layer and a second drift layer which is formed on a surface of the first drift layer and is lower in impurity concentration than the first drift layer.

The semiconductor device may further comprise a buffer layer of the first conductivity type which is located between the semiconductor substrate and the parallel pn structure.

A third aspect of the invention provides a semiconductor device that includes a high-impurity-concentration semiconductor substrate of a first conductivity type; a parallel pn structure which is formed on the semiconductor substrate and in which regions of the first conductivity type and regions of a second conductivity type are arranged alternately and joined to each other; a channel region of the second conductivity type which is formed on part of a surface of the parallel pn structure; source regions of the first conductivity type which occupy surface portions of the channel region; trenches which are adjacent to the source regions and penetrate through the channel region so as to reach the parallel pn structure; gate electrodes which are formed on surfaces of the trenches with gate oxide films interposed in between; an insulating layer formed on surfaces of the gate electrodes; a source electrode which is formed on part of a surface of the insulating layer and is in contact with surfaces of the channel region and the source regions; a drain electrode which is formed on part of the surface of the insulating layer and a surface of the regions of the first conductivity type of the parallel pn structure; and a diode which is formed on part of the surface of the insulating film in such a manner that it is in contact with the source electrode and the drain electrode and that its anode is located on the side of the source electrode and its cathode is located on the side of the drain electrode, and which is low in breakdown voltage than an active area.

A fourth aspect of the invention provides a semiconductor device that includes a high-impurity-concentration semiconductor substrate of a first conductivity type; a parallel pn structure which is formed on the semiconductor substrate and in which regions of the first conductivity type and regions of a second conductivity type are arranged alternately and joined to each other; a channel region of the second conductivity type which is formed on part of a surface of the parallel pn structure; a source region of the first conductivity type which occupies a surface portion of the channel region; a gate electrode which is formed on a surface of the parallel pn structure with a gate oxide film interposed in between so as to be in contact with the source region and the channel region; an insulating layer formed on a surface of the gate electrode; a source electrode which is formed on part of a surface of the insulating layer and is in contact with surfaces of the channel region and the source region; a drain electrode which is formed on part of the surface of the insulating layer and a surface of the regions of the first conductivity type of the parallel pn structure; and a diode which is formed on part of the surface of the insulating film in such a manner that it is in contact with the source electrode and the drain electrode and that its anode is located on the side of the source electrode and its cathode is located on the side of the drain electrode, and which is low in breakdown voltage than an active area.

A fifth aspect of the invention provides a semiconductor device that includes a high-impurity-concentration semiconductor substrate of a first conductivity type; a parallel pn structure which is formed on the semiconductor substrate and in which regions of the first conductivity type and regions of a second conductivity type are arranged alternately and joined to each other; a channel region of the second conductivity type which is formed on part of a surface of the parallel pn structure; source regions of the first conductivity type which occupy surface portions of the channel region; trenches which are adjacent to the source regions and penetrate through the channel region so as to reach the parallel pn structure; gate electrodes which are formed on surfaces of the trenches with gate oxide films interposed in between; an insulating layer formed on surfaces of the gate electrodes; a source electrode which is formed on part of a surface of the insulating layer and is in contact with surfaces of the channel region and the source regions; a drain electrode which is formed on part of the surface of the insulating layer and a surface of the regions of the first conductivity type of the parallel pn structure; and a diode which is formed on part of the surface of the insulating film in such a manner that it is in contact with the gate electrode and the drain electrode and that its anode is located on the side of the gate electrode and its cathode is located on the side of the drain electrode, and which is low in breakdown voltage than an active area.

A sixth aspect of the invention provides a semiconductor device that includes a high-impurity-concentration semiconductor substrate of a first conductivity type; a parallel pn structure which is formed on the semiconductor substrate and in which regions of the first conductivity type and regions of a second conductivity type are arranged alternately and joined to each other; a channel region of the second conductivity type which is formed on part of a surface of the parallel pn structure; a source region of the first conductivity type which occupies a surface portion of the channel region; a gate electrode which is formed on a surface of the parallel pn structure with a gate oxide film interposed in between so as to be in contact with the source region and the channel region; an insulating layer formed on a surface of the gate electrode; a source electrode which is formed on part of a surface of the insulating layer and is in contact with surfaces of the channel region and the source region; a drain electrode which is formed on part of the surface of the insulating layer and a surface of the regions of the first conductivity type of the parallel pn structure; and a diode which is formed on part of the surface of the insulating film in such a manner that it is in contact with the gate electrode and the drain electrode and that its anode is located on the side of the gate electrode and its cathode is located on the side of the drain electrode, and which is low in breakdown voltage than an active area.

The parallel pn structure may be striped by the regions of the first conductivity type and the regions of the second conductivity type.

In the semiconductor device according to each aspect of the invention, an avalanche phenomenon occurs earlier in the diode portion (where the breakdown voltage is lower) than in the active area and hence the device is not broken by avalanche current. Therefore, the on-resistance can be reduced while the device breakdown voltage is increased.

In the semiconductor device according to the fifth or sixth aspect of the invention, a diode avalanche phenomenon can be caused between the gate and the drain. Therefore, avalanche current flows through the gate electrode, whereby the gate voltage increases and the MOSFET is turned on (rendered conductive) temporarily. As a result, avalanche energy can be consumed without destruction of the device.

The semiconductor device according to the invention which uses a super-junction semiconductor substrate has advantages that it is simple in structure, low in on-resistance, and high in avalanche breakdown resistance.

BRIEF DESCRIPTION OF THE DRAWINGS

The invention will be described with reference to certain preferred embodiments thereof and the accompanying drawing, wherein.

DETAILED DESCRIPTION OF THE INVENTION

Semiconductor devices according to preferred embodiments of the present invention will be hereinafter described in detail with reference to the accompanying drawings.

Figure 1:
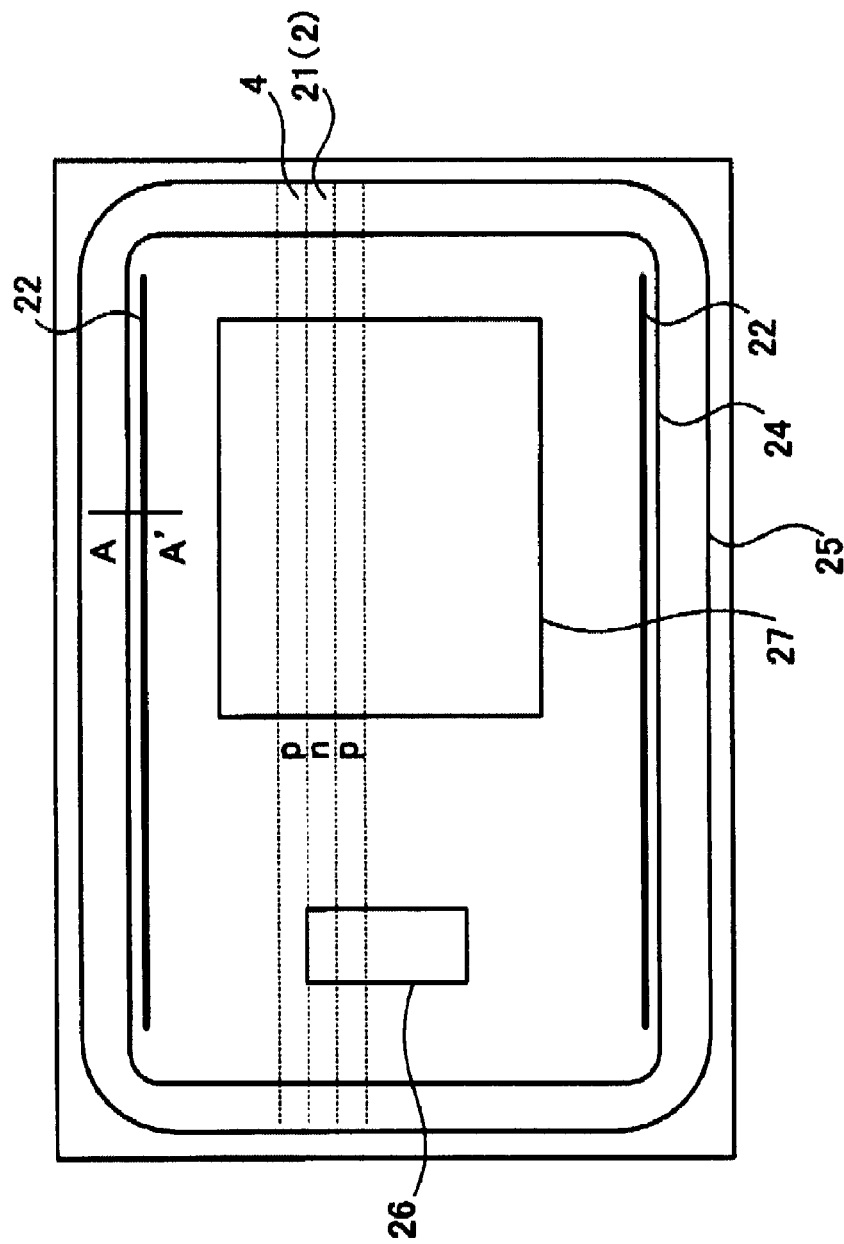
FIG. 1 is a plan view showing a semiconductor device according to a first embodiment of the present invention.

FIG. 1 is a plan view of a semiconductor device according to a first embodiment. As shown in FIG. 1, in the semiconductor device according to the first embodiment, in a plan view, an active area 24 is surrounded by a peripheral breakdown-resistant structure area 25 which is an inactive area. A device surface structure such as a gate pad 26 and a source pad 27 are formed in the active area 24. The peripheral breakdown-resistant structure area 25 extends alongside the entire outer circumference of the semiconductor device. An annular field plate is formed on a thick field oxide film along the outer circumference of the semiconductor device.

A parallel pn structure is formed inside so as to be separated from the chip end of the semiconductor device by a prescribed distance. In the parallel pn structure, p-type semiconductor layers 4 and n-type semiconductor layers 21/2 are arranged alternately so as to be joined to each other. Although FIG. 1 is drawn in such a manner that the parallel pn structure exists only in a central portion of the semiconductor device, actually it covers the entire active area 24 and peripheral breakdown-resistant structure area 25. High-concentration regions 22 are formed in boundary regions between the active area 24 and the peripheral breakdown-resistant structure area 25 so as to extend in the right-left direction in FIG. 1. No high-concentration regions are formed parallel with those portions of the peripheral breakdown-resistant structure area 25 which extend in the top-bottom direction in FIG. 1.

Figure 2:
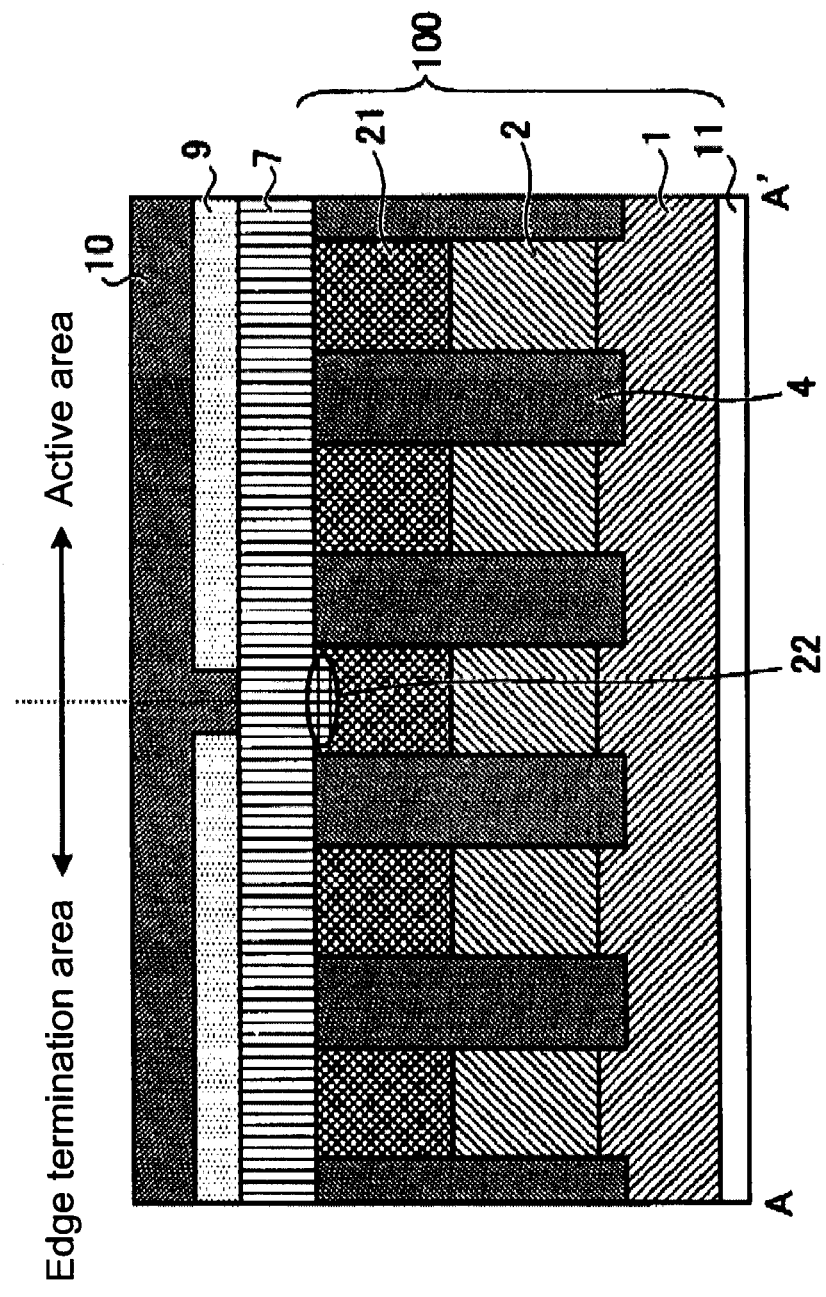
FIG. 2 is a sectional view taken along a cutting line A-A' in FIG. 1.

FIG. 2 is a sectional view taken along a cutting line A-A' in FIG. 1. The right half of FIG. 2 is the active area 24 where current of the MOSFET flows and the left half is the peripheral breakdown-resistant structure area 25. As shown in FIG. 2, the semiconductor device according to the first embodiment is manufactured by using a super-junction semiconductor substrate 100. The super-junction semiconductor substrate 100 has a parallel pn structure in which vertically extending p-type semiconductor layers 4 and vertically extending n-type semiconductor layers in each of which an n-type semiconductor layer 2 and a low-impurity-concentration n-type semiconductor layer 21 are laid in this order (on the surface of a high-impurity-concentration n-type semiconductor substrate 1) are arranged alternately and joined to each other. In the parallel pn structure, the boundary region between the active area 24 and the peripheral breakdown-resistant structure area 25 is an n-type semiconductor layer 21/2. In the parallel pn structure, the p-type semiconductor layers 4 may be longer than the n-type semiconductor layers 21/2 in the depth direction.

A p-type channel layer 7 is formed on the surface of the super-junction semiconductor substrate 100. Source layers 8 are formed in the channel layer 7 so as to occupy its surface portions (outside the part that is shown in FIG. 2). An insulating layer 9 is formed on the surfaces of the channel layer 7 and the source layers 8. A source electrode 10 is formed on the surface of the insulating layer 9. An opening is formed through the insulating layer 9 in a boundary region between the active area 24 and the peripheral breakdown-resistant structure area 25 so as to reach the channel layer 7, and the source electrode 10 is in contact with the channel layer 7 through the opening. The n-type high-concentration region 22 is formed on the surface of the n-type semiconductor layer 21 in the boundary region between the active area 24 and the peripheral breakdown-resistant structure area 25. A diode is formed in the portion where the high-concentration region 22 is in contact with the p-type channel layer 7. The breakdown voltage of the diode can be varied by the concentration of the high-concentration region 22. The breakdown voltage of the diode is set lower than that of the active area 24. Therefore, an avalanche phenomenon can be caused earlier in the high-concentration regions 22 than in the active area 24. It is preferable that each high-concentration region 22 be located at the center between the p-type semiconductor layers 4 adjacent to it. On the other hand, each portion where the source electrode 10 is in contact with the channel layer 7 need not always be located at the center between these p-type semiconductor layers 4.

Since the n-type semiconductor layers 21 are provided on the surface of the n-type semiconductor layers 2, the impurity concentration of the super-junction semiconductor substrate 100 is made low on the device surface side. As a result, the difference in breakdown voltage between the high-concentration regions 22 and the super-junction semiconductor substrate 100 becomes small and the breakdown voltage of the device as a whole is increased.

Exemplary dimensions and impurity concentrations of the individual layers are as follows, though in the invention the values of those parameters are not limited to the following values. The length of the parallel pn structure in the device depth direction is about 47 µm. The width of the n-type semiconductor layers 2 and 21 and the width of the p-type semiconductor layers 4 are about 2 µm.

The impurity concentration of the n-type semiconductor substrate 1 is about $2 \times 10^{18}$ cm$^{-3}$. The impurity concentration of the n-type semiconductor layers 2 is about $4.46 \times 10^{15}$ cm$^{-3}$. The impurity concentration of the n-type semiconductor layers 21 is about $2.0 \times 10^{14}$ cm$^{-3}$, which is lower than that of the n-type semiconductor layers 2.

Figure 3:
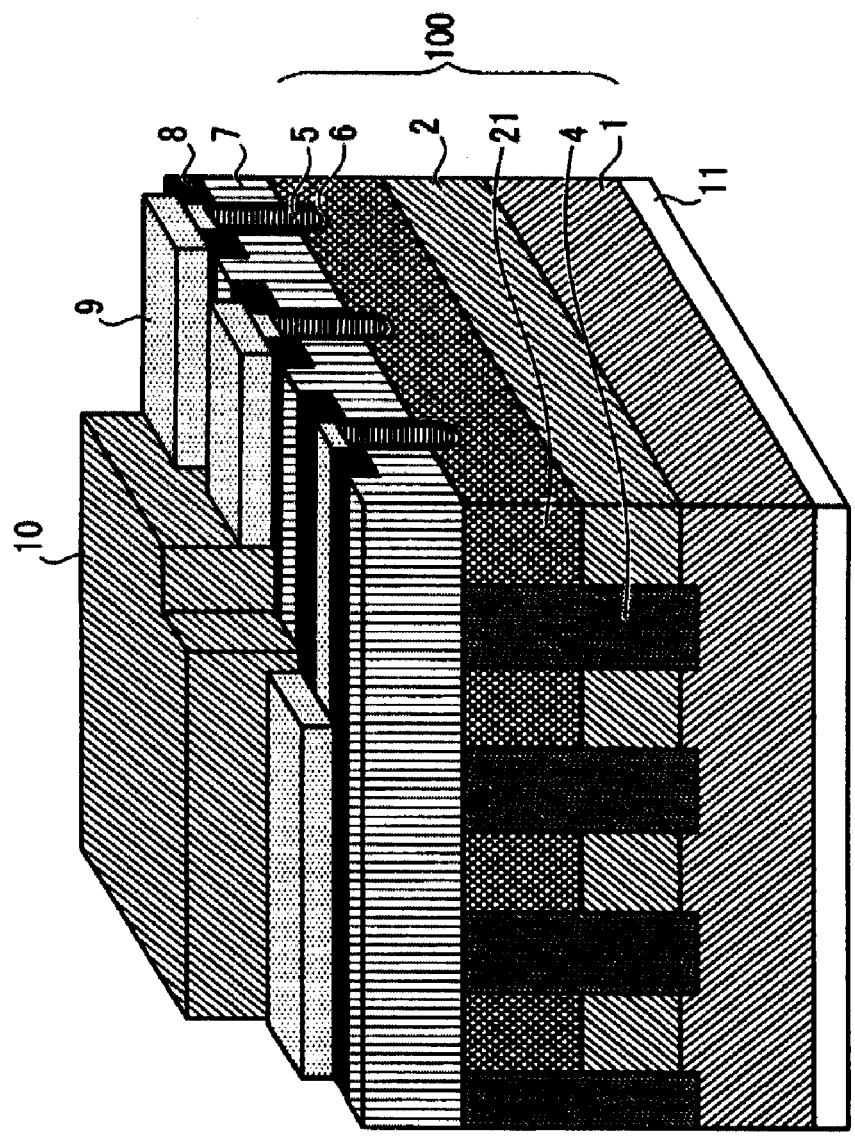
FIG. 3 is a perspective view showing an example of the structure of an active area of the semiconductor device according to the first embodiment.

Next, an example of the structure of the active area 24 of the semiconductor device according to the first embodiment will be described. FIG. 3 is a perspective view showing an example of the structure of the active area 24 of the semiconductor device according to the first embodiment. As shown in FIG. 3, in the active area 24, source layers 8 are formed in the channel layer 7 (which is formed on the surface of the super-junction semiconductor substrate 100) so as to occupy its surface portions and to extend in such a direction as to cross the stripes of the parallel pn structure. Trench gates are formed adjacent to the source layers 8 so as to reach the super-junction semiconductor substrate 100. Gate electrodes 5 are formed on the surfaces of the trenches with gate oxide film 6 interposed in between, respectively. An insulating layer 9 is formed on the source layers 8 and the gate electrodes 5. A source electrode 10 is formed on the insulating layer 9 and is electrically connected to the source layers 8 and the channel layer 7. A drain electrode 11 is formed on the back surface of the super-junction semiconductor substrate 100. The drain electrode 11 is electrically connected to the n-type semiconductor substrate 1.

Figure 4:
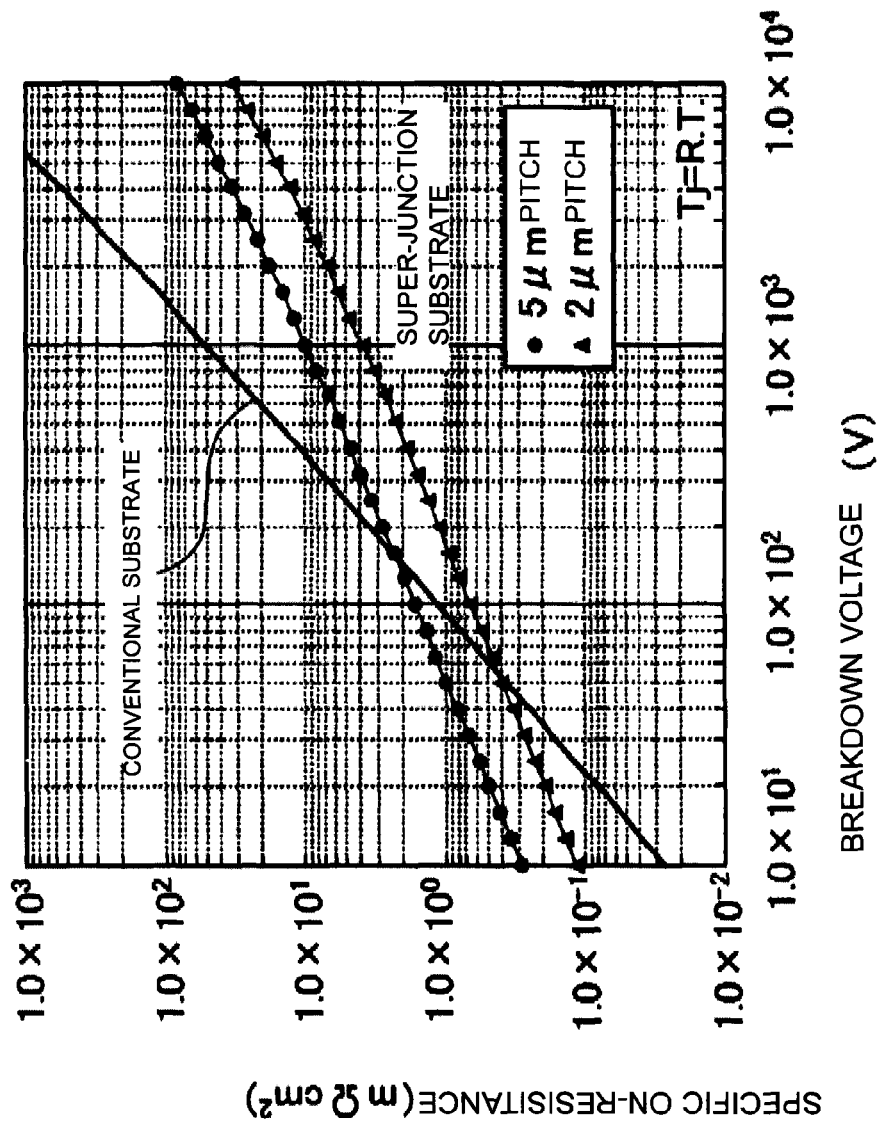
FIG. 4 is a graph showing a tradeoff relationship between the on-resistance and the device breakdown voltage.

Next, a description will be made of a tradeoff relationship between the on-resistance and the device breakdown voltage of the semiconductor device according to the first embodiment. FIG. 4 is a graph showing a tradeoff relationship between the on-resistance and the device breakdown voltage. In FIG. 4, the vertical axis represents the on-resistance and the horizontal axis represents the device breakdown voltage. The curve with plotting points "●" and the curve with plotting points "▲" represent characteristics of the super-junction semiconductor substrate 100 in cases that the repetition pitch of the p-type semiconductor layers 4 and the n-type semiconductor layers 21 and 2 are 5 µm and 2 µm, respectively. The on-resistance of the active area 24 of the semiconductor device according to the first embodiment is about 3 m$\Omega \cdot$cm$^2$ and the device breakdown voltage is about 758 V. Therefore, as seen from FIG. 4, the tradeoff relationship between the on-resistance and the device breakdown voltage of the semiconductor device according to the first embodiment whose parallel pn structure has the pitch 2 μm is superior to that of a device having a conventional substrate structure. And the semiconductor device according to the first embodiment whose parallel pn structure has the pitch 5 μm likewise provides a better tradeoff relationship between the on-resistance and the device breakdown voltage than the device having the conventional substrate structure.

Figure 5:
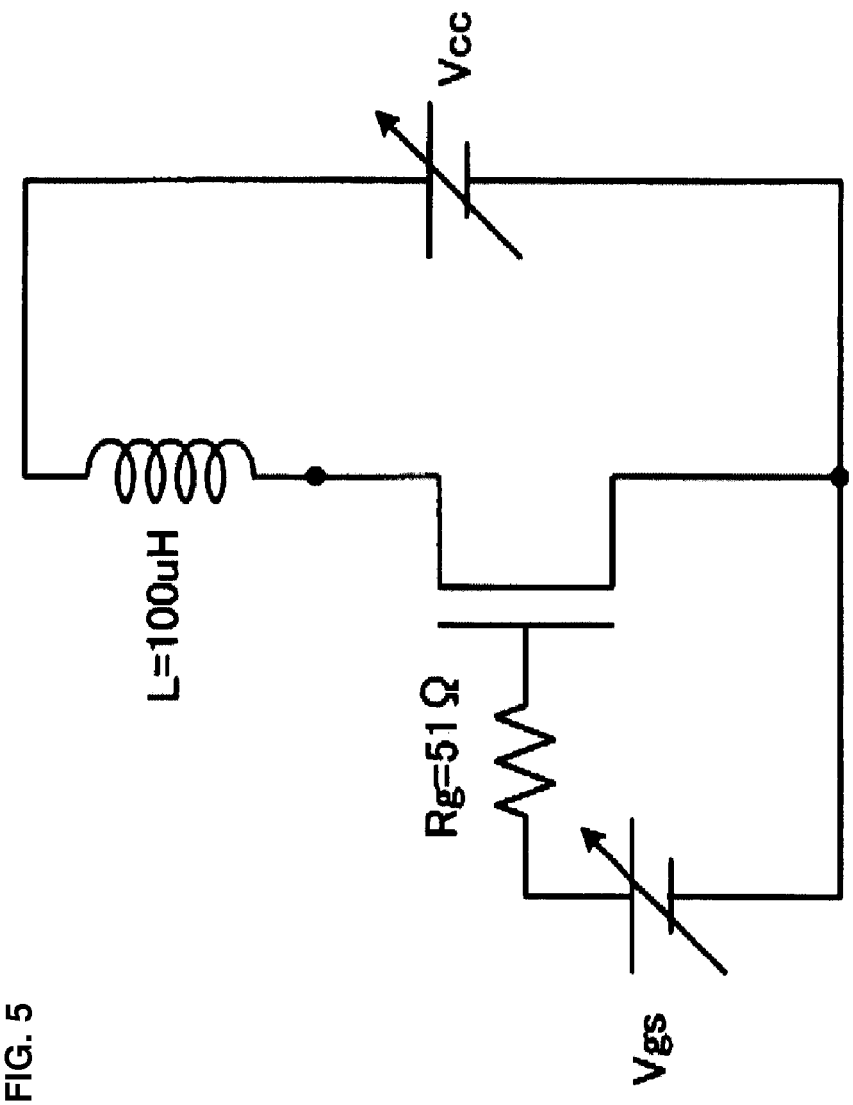
FIG. 5 is a circuit diagram of a measuring circuit.
Figure 6:
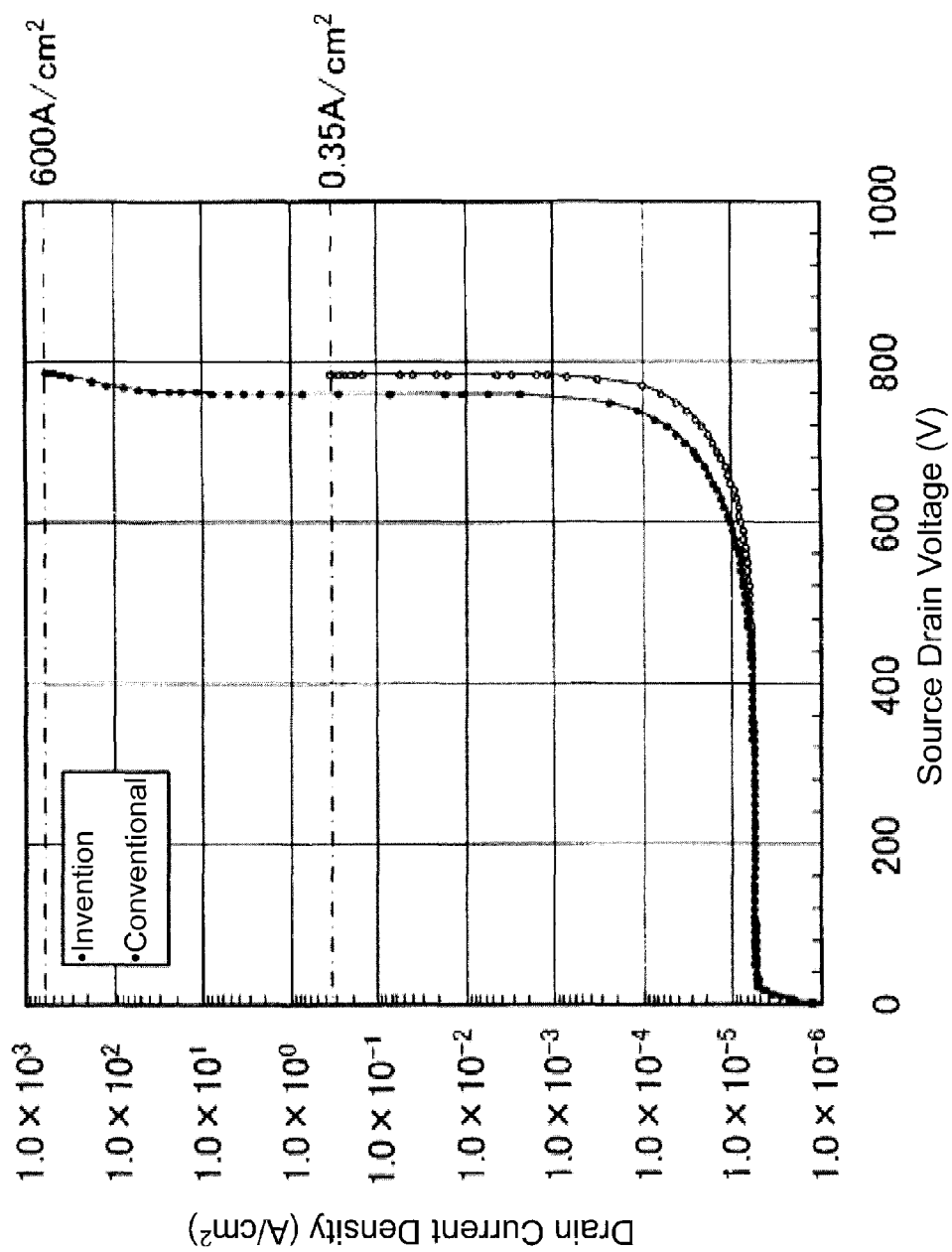
FIG. 6 is a graph showing a relationship between the drain current and the source-drain voltage.

Next, the device breakdown voltage will be described. For example, the device breakdown voltage is defined as a source-drain voltage at which the density of current flowing through the device is 1 mA/cm$^2$ in a state that the gate is short-circuited to the source and a high voltage is applied to the drain. FIG. 5 is a circuit diagram of a measuring circuit. Device breakdown voltages mentioned below were measured by using the measuring circuit of FIG. 5. FIG. 6 is a graph showing a relationship between the drain current and the source-drain voltage. In FIG. 6, the vertical axis represents the drain current and the horizontal axis represents the source-drain voltage. The curve with plotting points "●" and the curve with plotting points "○" represent characteristics of the semiconductor device according to the first embodiment and a conventional semiconductor device, respectively. The conventional semiconductor device is a semiconductor device that uses the super-junction semiconductor substrate 100 but does not have the high-concentration regions 22.

As seen from FIG. 6, the conventional semiconductor device is broken when an avalanche state is established, though its device breakdown voltage is 778 V. The avalanche state means a state that the drain current is larger than 0.35 A/cm$^2$, for example. On the other hand, the device breakdown voltage of the semiconductor device according to the first embodiment is 758 V. Although the device breakdown voltage is somewhat lower than that of the conventional semiconductor device, the semiconductor device according to the first embodiment is not broken even after an avalanche state is established; it enables a flow of drain current until it reaches 600 A/cm$^2$.

Figure 7:
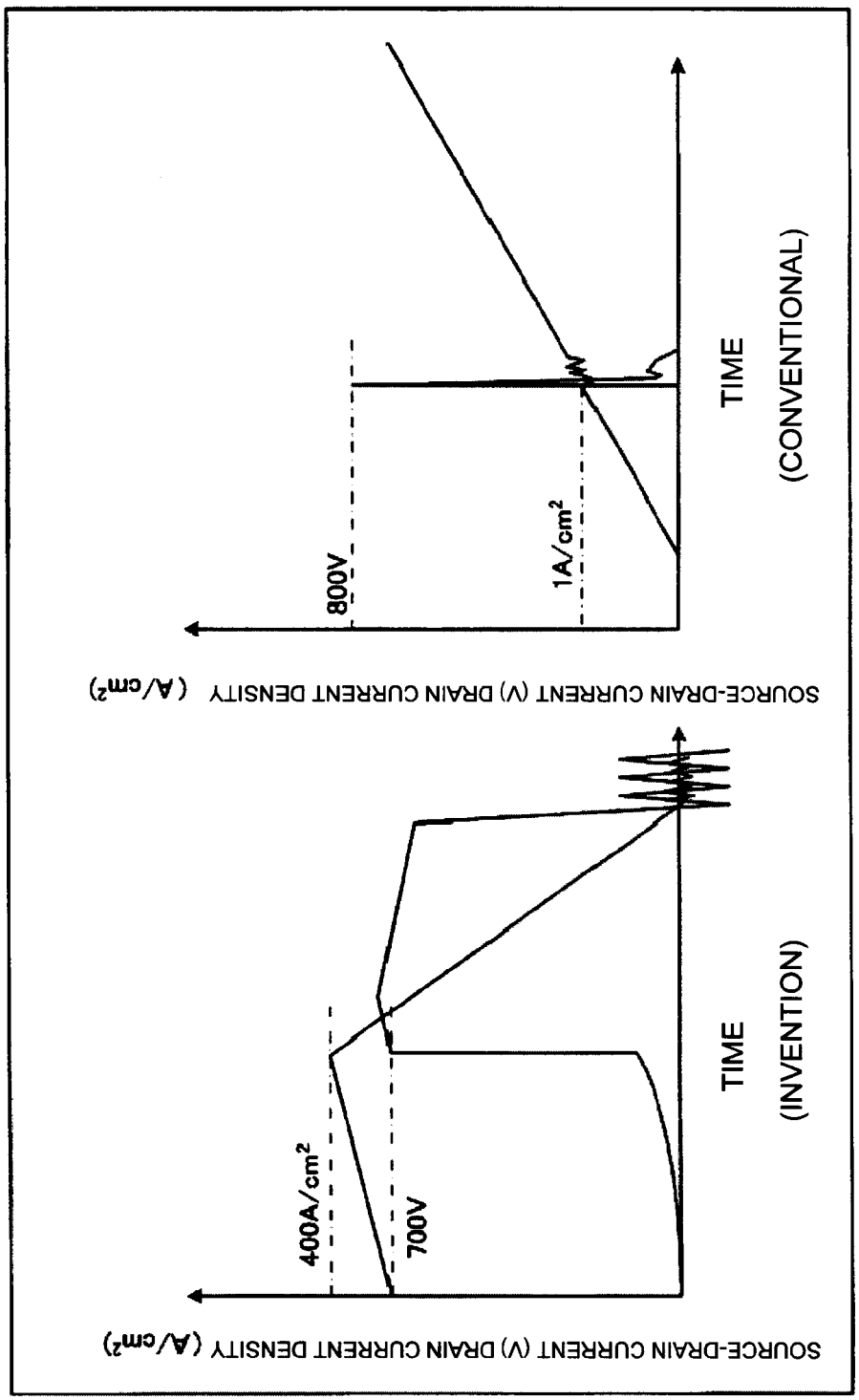
FIG. 7 is graph showing L-load turn-off waveforms of the semiconductor device according to the first embodiment and a conventional semiconductor device.

Next, the L-load turn-off waveform will be described. FIG. 7 is a graph showing L-load turn-off waveforms of the semiconductor device according to the first embodiment and a conventional semiconductor device. In FIG. 7, the vertical axis represents the drain-source voltage or the drain current and the horizontal axis represents time. As seen from FIG. 7, the semiconductor device according to the first embodiment can be turned off at a large current of 400 A/cm$^2$ without being broken. On the other hand, the conventional semiconductor device is broken and cannot be turned off.

Almost the same characteristics as described above are obtained even in the case where in the semiconductor device according to the first embodiment the trench gate structure is replaced by a planar gate structure. In this case, the device breakdown voltage is 759 V and the device is not broken until the drain current reached 613 A/cm$^2$. As for the L-load turn-off waveform, the device can be turned off at a large current of 415 A/cm$^2$ without being broken. In the case of the planar gate type, the on-resistance is about 10% higher than in the trench gate type and is equal to about 3.3 m$\Omega \cdot$cm$^2$.

Figure 8:
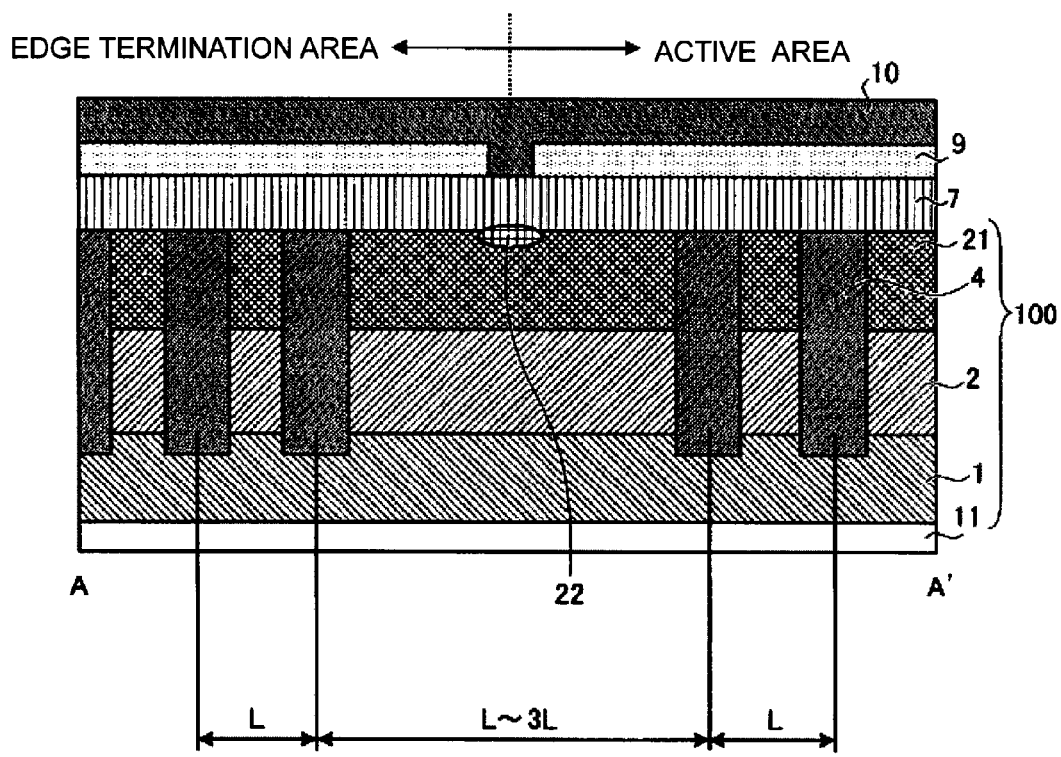
FIG. 8 is a sectional view showing the interval between p-type semiconductor layers located on both sides of a built-in diode portion in the semiconductor device according to the first embodiment.
Figure 9:
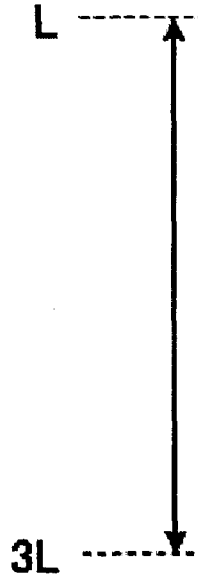
FIG. 9 is a table showing a relationship between the interval between the p-type semiconductor layers located on both sides of each built-in diode portion and the device breakdown voltage.

Next, the interval between the p-type semiconductor layers 4 located on both sides of each high-concentration region 22 will be described. FIG. 8 is a sectional view showing the interval between the p-type semiconductor layers 4 located on both sides of a built-in diode portion of the semiconductor device according to the first embodiment. FIG. 9 is a table showing a relationship between the interval between the p-type semiconductor layers 4 located on both sides of each built-in diode portion and the device breakdown voltage. As shown in FIG. 8, the interval between the p-type semiconductor layers 4 located on both sides of the high-concentration region 22 of the super-junction semiconductor substrate 100 is set longer than the interval between the other p-type semiconductor layers 4. Where the width of the p-type semiconductor layers 4 and the n-type semiconductor layers 2 and 21 is 2 μm, the interval between the other p-type semiconductor layers 4 is 4 μm. In the example of FIGS. 8 and 9, the interval L is set at 4 μm, for example.

Device breakdown voltages were measured while the interval between the p-type semiconductor layers 4 located on both sides of each high-concentration region 22 was varied from 3 μm to 20 μm as shown in FIG. 9. As shown in FIG. 9, when the interval between the p-type semiconductor layers 4 located on both sides of each high-concentration region 22 was 3 μm, the device breakdown voltage was 715 V. That is, the device breakdown voltage decreased steeply by more than 8% from the value 778 V that was obtained when the interval between the p-type semiconductor layers 4 located on both sides of each high-concentration region 22 was 4 μm, which is equal to L. When the interval between the p-type semiconductor layers 4 located on both sides of each high-concentration region 22 was 13 μm, the device breakdown voltage was 688 V. That is, the device breakdown voltage decreased steeply by more than 10% from the value 770 V that was obtained when the interval between the p-type semiconductor layers 4 located on both sides of each high-concentration region 22 was 12 μm, which is equal to 3 L. These facts show that it is preferable that the interval between the p-type semiconductor layers 4 located on both sides of each high-concentration region 22 be in a range of L to 3 L. When the interval between the p-type semiconductor layers 4 located on both sides of each high-concentration region 22 is set in the range of L to 3 L, depletion layers interfere with each other and the device breakdown voltage can be increased.

Figure 10:
FIGS. 10-14 are sectional views showing in-process structures of a super-junction semiconductor substrate which is used in the semiconductor device according to the first embodiment.

Next, a manufacturing method of the super-junction semiconductor substrate 100 that is used in the semiconductor device according to the first embodiment will be described. FIGS. 10-14 are sectional views showing in-process structures of a super-junction semiconductor substrate which is used in the semiconductor device according to the first embodiment. First, as shown in FIG. 10, a high-impurity-concentration n-type semiconductor substrate 1 is prepared. As for the surface orientation of the n-type semiconductor substrate 1, the (100) surface or a surface equivalent to it is employed. For example, the n-type semiconductor substrate 1 contains an impurity antimony (Sb) at about 2×10$^{18}$ cm$^3$.

Figure 11:
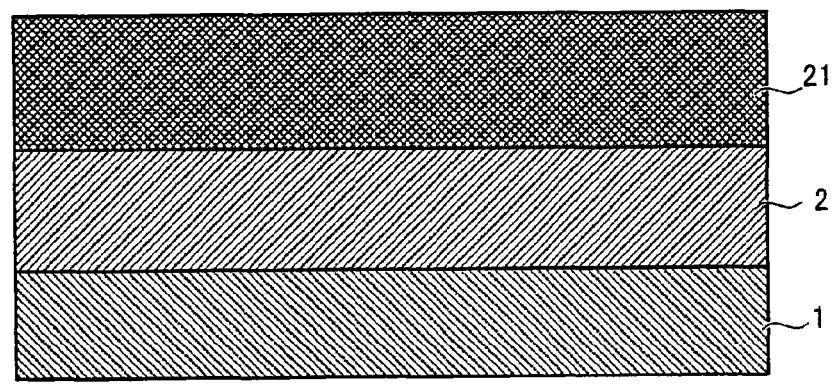

Then, as shown in FIG. 11, an n-type semiconductor layer 2 of about 40 μm in thickness is formed on the n-type semiconductor substrate 1 at an impurity concentration of about 4.46×10$^{15}$ cm$^{-3}$. Then, an n-type semiconductor layer 21 of about 10 μm in thickness is grown epitaxially on the surface of the n-type semiconductor layer 2 at an impurity concentration of about 2.0×10$^{14}$ cm$^3$. The n-type semiconductor layers 2 and 21 are doped with phosphorus, for example.

Figure 12:
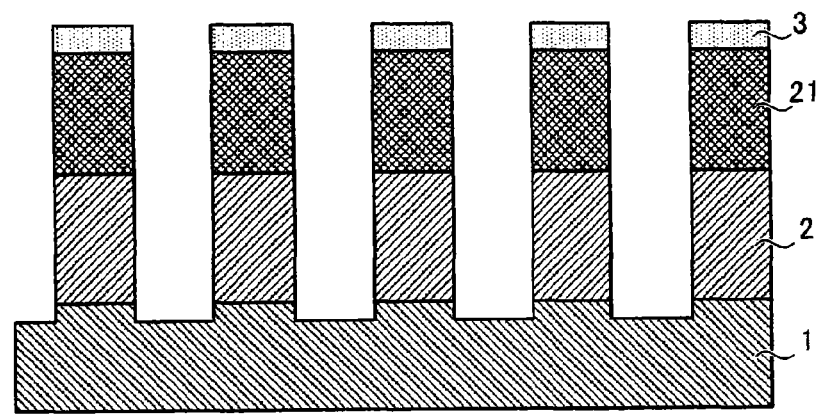

Then, as shown in FIG. 12, an oxide film 3 of about 1.6 μm, for example, in thickness is formed on the surface of the n-type semiconductor layer 21. The oxide film 3 is subjected to photolithography and etching, whereby an oxide film mask is formed in which 2-μm-wide stripes are arranged with 2-μm-wide gaps. Trench etching is then performed, whereby trenches of about 2 μm in width are formed with gaps of about 2 μm through the n-type semiconductor layers 2 and 21 so as to reach the n-type semiconductor substrate 1. The surface of the n-type semiconductor substrate 1 may be etched to some extent, in which case the surface of the n-type semiconductor substrate 1 is jagged.

Figure 13:
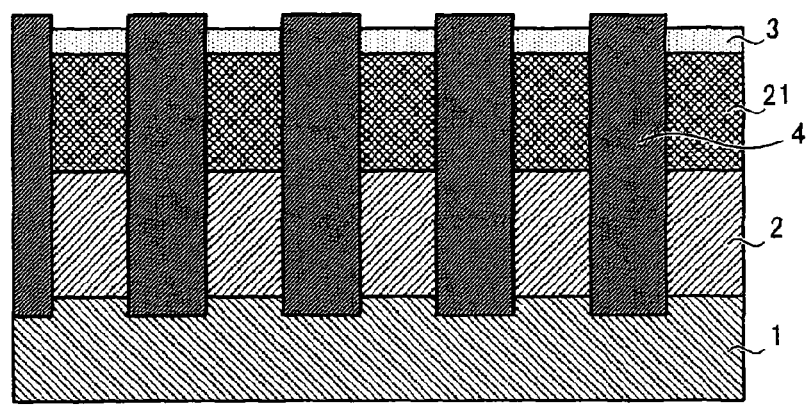
Figure 14:
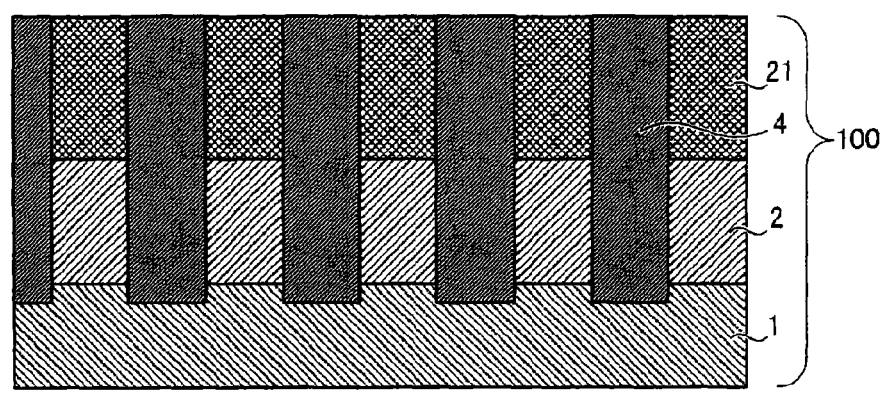

Then, as shown in FIG. 13, boron-doped p-type semiconductor layers 4 are grown epitaxially in the trenches so as to project from the surface of the oxide film 3, whereby a parallel pn structure is formed. The parallel pn structure is striped in such a manner that the vertically extending p-type semiconductor layers 4 and the vertically extending n-type semiconductor layers each consisting of n-type semiconductor layers 2 and 21 are arranged alternately. Then, as shown in FIG. 14, CMP (chemical mechanical polishing) and oxide film etching are performed, whereby the surfaces of the n-type semiconductor layers 21 are exposed. A super-junction semiconductor substrate 100 is thus completed. The thickness of the parallel pn structure of the super-junction semiconductor substrate 100 is about 47 μm.

Next, a manufacturing method of the active area 24 of the semiconductor device according to the first embodiment will be described. As shown in FIG. 3, a channel layer 7 is formed on the surface of the super-junction semiconductor substrate 100. Then, trenches are formed through the channel layer 7 so as to reach the super-junction semiconductor substrate 100 and to extend in a direction that crosses the stripes of the parallel pn structure. For example, trenches of about 1.2 μm in width and about 3.5 μm in depth are formed with gaps of about 3.5 μm. The radius of curvature of those portions of the semiconductor layer 21 which define the trench bottoms can be made about 0.6 μm by forming the trenches with sufficient care. Then, gate oxide films 6 of 100 nm, for example, in thickness are formed on the trench surfaces and gate electrodes 5 are charged into the trenches.

Then, source layers 8, an insulating layer 9, a source electrode 10, a drain electrode 11, a passivation layer (not shown), etc. are formed by an ordinary manufacturing method of a MOS structure, whereby an active area 24 is completed. The ordinary manufacturing process of a MOS structure will not be described here because it is not an essential part of the invention.

Next, a manufacturing method of each high-concentration region 22 of the semiconductor device according to the first embodiment will be described. As shown in FIG. 2, an opening is formed through the insulating layer 9 in a boundary region between the active area 24 and the peripheral breakdown-resistant structure area 25 so as to reach the channel layer 7. As a result, the source electrode 10 is brought into contact with the channel layer 7 in this region. The parallel pn structure is formed so that this region is opposed to an n-type semiconductor layer 21. As a result, the channel layer 7 is in contact with this n-type semiconductor layer 21 of the super-junction semiconductor substrate 100 in the boundary region between the active area 24 and the peripheral breakdown-resistant structure area 25. Then, a high-concentration region 22 is formed in the region where the channel layer 7 is joined to the n-type semiconductor layer 21. For example, a high-concentration n-type layer is formed as the high-concentration region 22 by implanting phosphorus by ion implantation, whereby a diode is formed that is lower in breakdown voltage than the n-type semiconductor layer 21.

Figure 15:
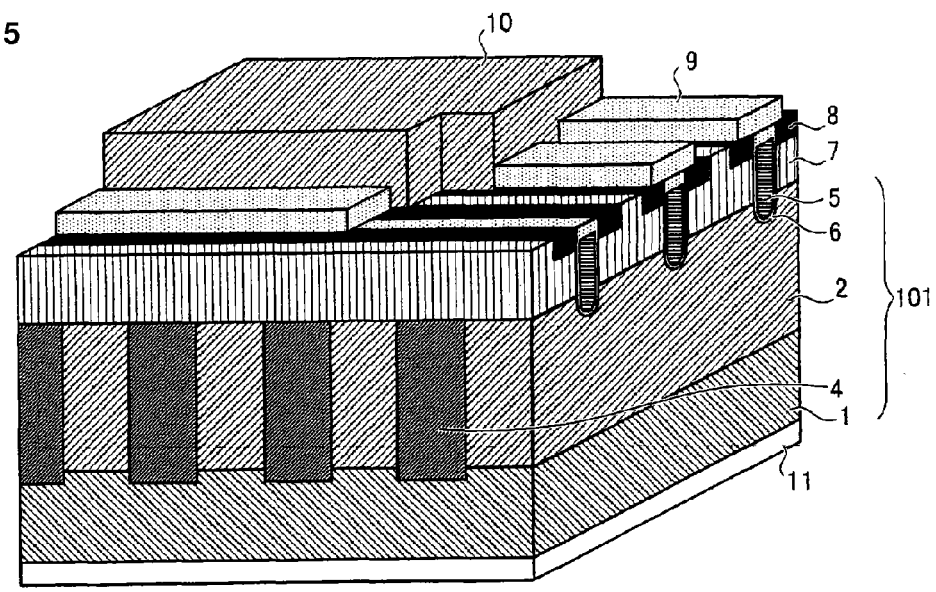
FIG. 15 is a perspective view showing the structure of a semiconductor device according to a modification of the first embodiment.

FIG. 15 is a perspective view showing the structure of a semiconductor device according to a modification of the first embodiment. As shown in FIG. 15, no n-type semiconductor layers 21 are formed on the surfaces of n-type semiconductor layers 2 and a channel layer 7 is formed directly on the surfaces of the n-type semiconductor layers 2. In this case, a super-junction semiconductor substrate 101 is configured in such a manner that a parallel pn structure in which vertically extending n-type semiconductor layers 2 and vertically extending p-type semiconductor layers 4 are arranged alternately and joined to each other is formed on an n-type semiconductor substrate 1.

According to the first embodiment, the high-concentration regions 22 that are lower in breakdown voltage than the n-type semiconductor layer 21 or 2 can be formed between the source and the drain. Therefore, when a high voltage such as a surge voltage is applied to the device, its energy can be absorbed by avalanche current flowing through the high-concentration regions 22. As a result, the on-resistance can be reduced while the avalanche breakdown resistance of the device is increased.

Figure 16:
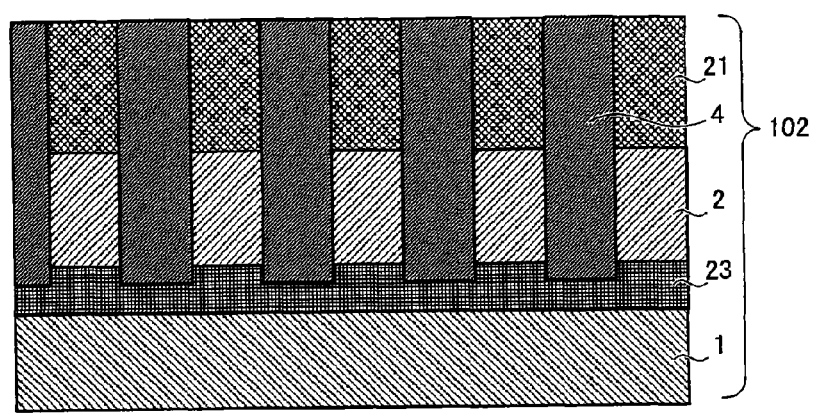
FIG. 16 is a sectional view showing the structure of a super-junction semiconductor substrate which is used in a semiconductor device according to a second embodiment.

Next, a semiconductor device according to a second embodiment will be described. FIG. 16 is a sectional view showing the structure of a super-junction semiconductor substrate which is used in the semiconductor device according to the second embodiment. The semiconductor device according to the second embodiment is different from that according to the first embodiment in that an n-type drift layer 23 is formed between the n-type semiconductor substrate 1 and the parallel pn structure. The n-type drift layer 23 functions as a buffer layer. The on-resistance of the semiconductor device according to the second embodiment is 5 μΩ·cm$^2$, and the tradeoff relationship between the on-resistance and the device breakdown voltage is better than in a conventional substrate structure. The device breakdown voltage of the semiconductor device according to the second embodiment is 768 V, and the device is not broken until the drain current reaches 780 A/cm$^2$. As for the L-load turn-off waveform, the device can be turned off at a large current of 425 A/cm$^2$ without being broken. The breakdown voltage can thus be increased because the n-type drift layer 23 functions as a buffer layer.

Figure 17:
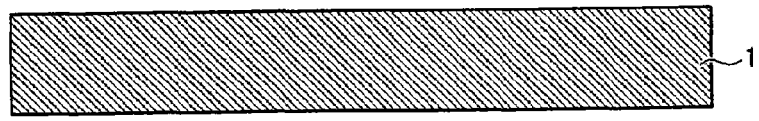
FIGS. 17-21 are sectional views showing in-process structures of a super-junction semiconductor substrate which is used in the semiconductor device according to the second embodiment.

Next, a manufacturing method of the super-junction semiconductor substrate 102 that is used in the semiconductor device according to the second embodiment will be described. FIGS. 17-21 are sectional views showing in-process structures of a super-junction semiconductor substrate which is used in the semiconductor device according to the second embodiment. First, as shown in FIG. 17, an n-type semiconductor substrate 1 is prepared which is similar to the one used in the first embodiment. As for the surface orientation of the n-type semiconductor substrate 1, the (100) surface or a surface equivalent to it is employed. For example, the n-type semiconductor substrate 1 contains an impurity antimony (Sb) at about 2×10$^{18}$ cm$^{-3}$.

Figure 18:
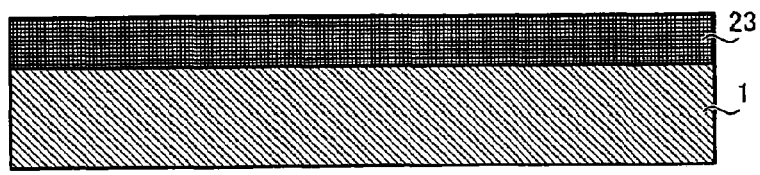
Figure 19:
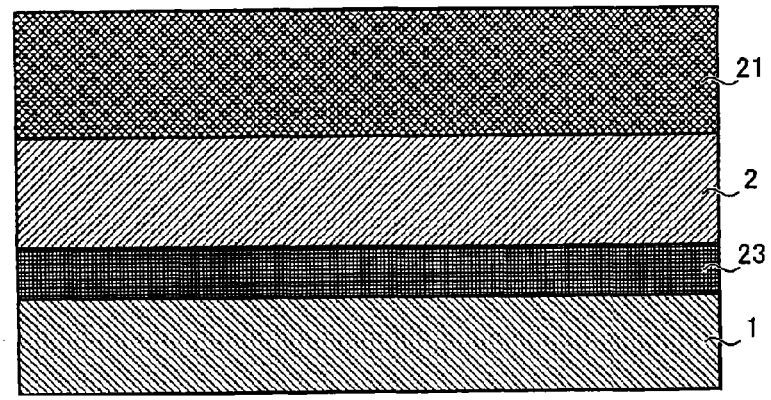

Then, as shown in FIG. 18, an n-type drift layer 23 of about 5 μm in thickness is formed on the n-type semiconductor substrate 1 at an impurity concentration of about 1.0×10$^{15}$ cm$^{-3}$. Then, as shown in FIG. 19, an n-type semiconductor layer 2 and an n-type semiconductor layer 21 are formed on the surface of the n-type drift layer 23 in this order by the same method as used in the first embodiment.

Figure 20:
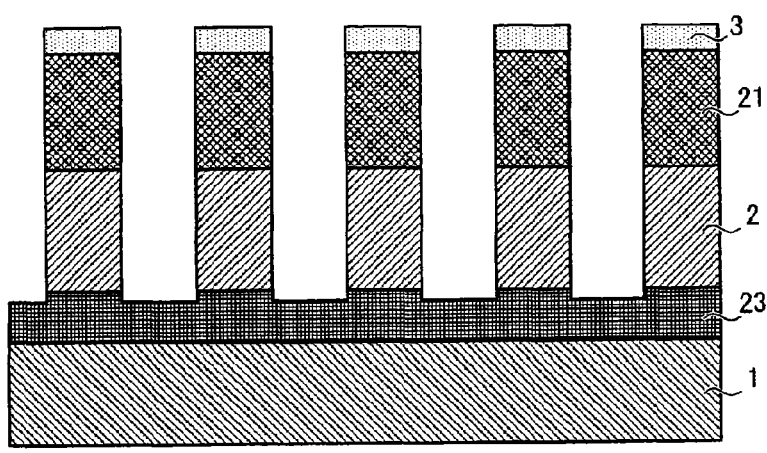

Then, as shown in FIG. 20, an oxide film 3 of about 1.6 μm, for example, in thickness is formed on the surface of the n-type semiconductor layer 21. The oxide film 3 is subjected to photolithography and etching, whereby an oxide film mask is formed in which 2-μm-wide stripes are arranged with 2-μm-wide gaps. Trench etching is then performed, whereby trenches of about 2 μm in width are formed with gaps of about 2 μm through the n-type drift layer 23 and the n-type semiconductor layers 2 and 21. The trenches are formed so as not to reach the n-type semiconductor substrate 1.

Figure 21:
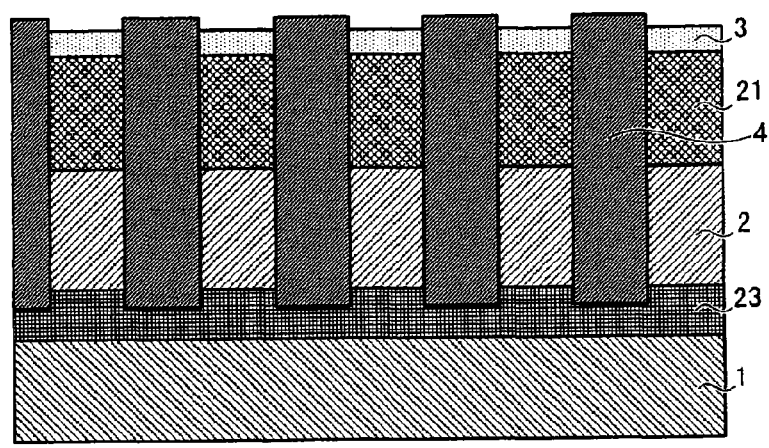

Then, as shown in FIG. 21, boron-doped p-type semiconductor layers 4 are grown epitaxially in the trenches so as to project from the surface of the oxide film 3, whereby a parallel pn structure is formed. The parallel pn structure is striped in such a manner that the vertically extending p-type semiconductor layers 4 and the vertically extending n-type semiconductor layers each consisting of n-type semiconductor layers 2 and 21 are arranged alternately. Then, as shown in FIG. 16, CMP and oxide film etching are performed, whereby the surfaces of the n-type semiconductor layers 21 are exposed. A super-junction semiconductor substrate 102 is thus completed. The thickness of the parallel pn structure of the super-junction semiconductor substrate 102 is about 47 µm. Subsequently, an active area 24 and high-concentration regions 22 are formed by the same manufacturing method as in the first embodiment.

By virtue of the buffer layer provided between the n-type semiconductor substrate 1 and the parallel pn structure, the semiconductor device according to the second embodiment can be made higher in avalanche breakdown resistance than the semiconductor device according to the first embodiment.

Although the first and second embodiments are directed to the boundary region between the active area 24 and the peripheral breakdown-resistant structure area 25, their concepts may be applied to the region under the gate pad 26.

Figure 22:
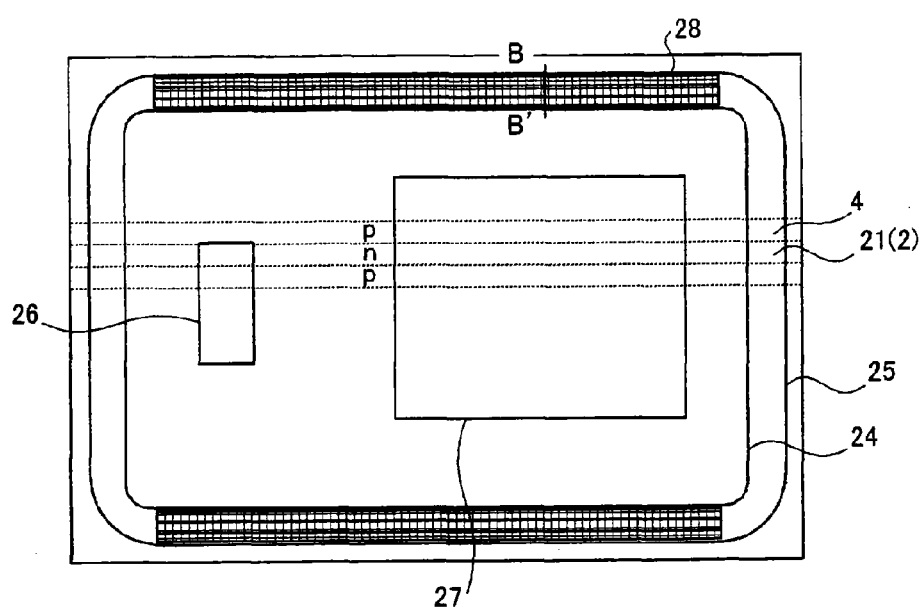
FIG. 22 is a plan view showing the structure of a semiconductor device according to a third embodiment.

Next, a semiconductor device according to a third embodiment will be described. FIG. 22 is a plan view showing the structure of a semiconductor device according to the third embodiment. As shown in FIG. 22, an active area 24 in which a device surface structure is formed is surrounded by a peripheral breakdown-resistant structure area 25 which is provided with an annular field plate that is formed on a thick field oxide film. Although FIG. 22 is drawn in such a manner that a parallel pn structure exists only in a central portion of the semiconductor device, actually it covers the entire active area 24 and peripheral breakdown-resistant structure area 25. And pn diode structures 28 are formed in the peripheral breakdown-resistant structure area 25 so as to extend in the right-left direction in FIG. 22. In each pn diode structure, p-type regions and n-type regions are arranged alternately in the direction from the outside end of the peripheral breakdown-resistant structure area 25 to the chip inside. No pn diode structures are formed in those portions of the peripheral breakdown-resistant structure area 25 which extend in the top-bottom direction in FIG. 22, because if such pn diode structures were formed their electric fields might influence the field plate that is formed in the peripheral breakdown-resistant structure area 25.

Figure 23:
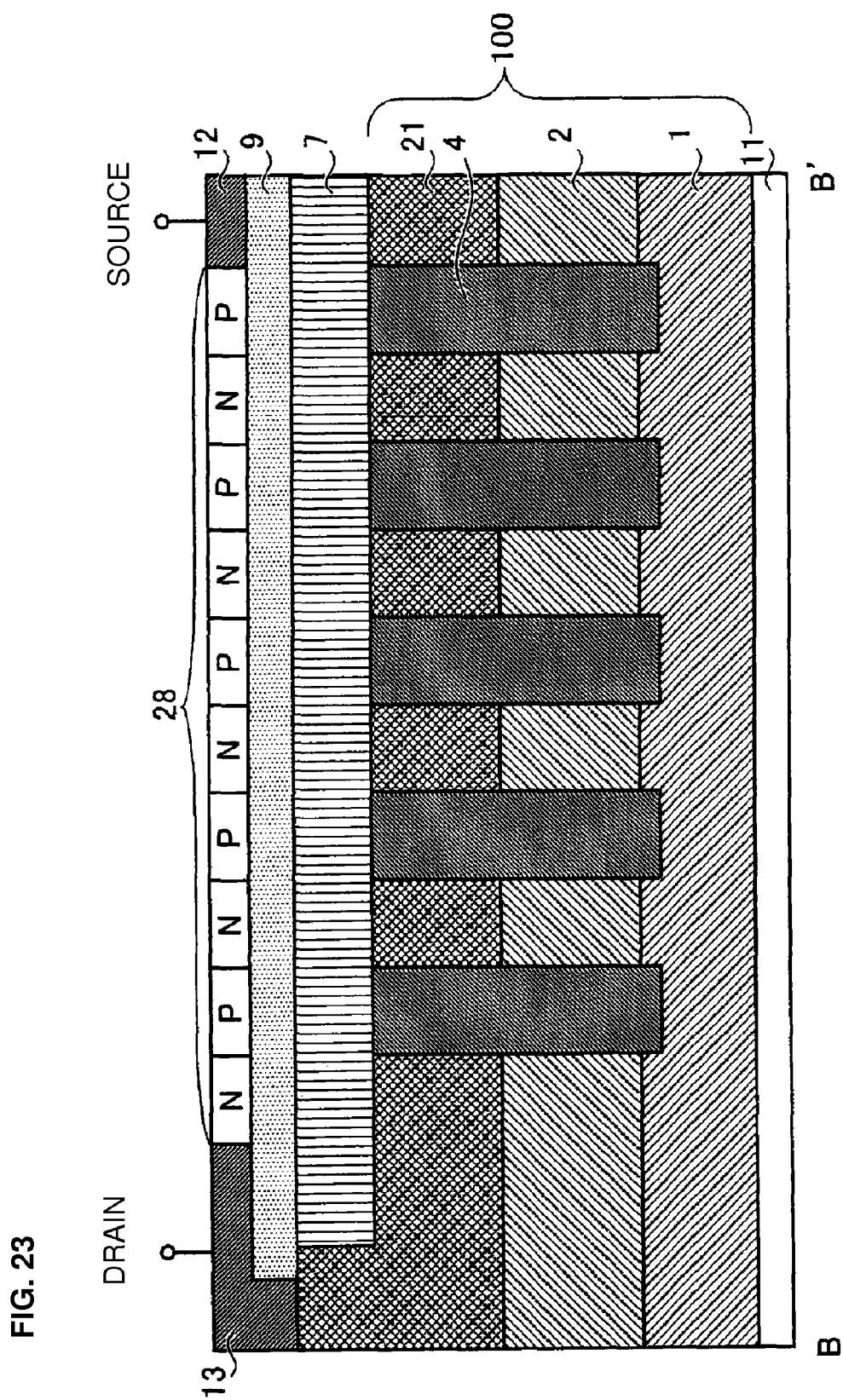
FIG. 23 is a sectional view taken along a cutting line B-B' in FIG. 22.

FIG. 23 is a sectional view taken along a cutting line B-B' in FIG. 22. The semiconductor device according to the third embodiment is different from that according to the first or second embodiment in that the high-concentration regions 22 are not provided and, instead, the pn diode structures 28 each of which is a series connection of multiple pn diodes are formed on an insulating layer 9 in the peripheral breakdown-resistant structure area 25. Each pn diode structure 28 is formed between a source electrode 12 and a drain electrode 13 on the surface of the insulating layer 9 in the peripheral breakdown-resistant structure area 25. The source electrode 12 and the drain electrode 13 are electrically connected to a source electrode 10 and a drain electrode 11, respectively, in the active area 24. The anode of each pn diode structure 28 is located on the source side and its cathode is located on the drain side. The pn diode structures 28 are lower in breakdown voltage than the parallel pn structure.

The device breakdown voltage of the semiconductor device according to the third embodiment is 758 V, and the device is not broken until the drain current reaches 650 A/cm². As for the L-load turn-off waveform, the device can be turned off at a large current of 405 A/cm² without being broken. Almost the same characteristics as described above are obtained even in the case where in the semiconductor device according to the third embodiment the trench gate structure is replaced by a planar gate structure. In this case, the device breakdown voltage is 779 V and the device is not broken until the drain current reaches 653 A/cm². As for the L-load turn-off waveform, the device can be turned off at a large current of 419 A/cm² without being broken.

Next, a manufacturing method of the semiconductor device according to the third embodiment will be described. First, a super-junction semiconductor substrate 100, 101, or 102 is formed by the same manufacturing method as used in the first or second embodiment. Then, a channel layer 7, source layers 8, an insulating layer 9, a source electrode 12, a drain electrode 13, a passivation layer (not shown), etc. are formed by an ordinary manufacturing method of a MOS structure. In the semiconductor device according to the third embodiment, the drain electrode 13 is formed so as to be in contact with the surfaces of the n-type semiconductor layers 21 and the insulating layer 9 and is electrically connected to the drain electrode 11 in the active area 24. Then, each polysilicon pn diode structure 28 is formed on the surface of the insulating layer 9 in such a manner that it is in contact with the source electrode 12 and the drain electrode 13 and that the anode is located on the source side and the cathode is located on the drain side.

In the semiconductor device according to the third embodiment, the on-resistance can be reduced while the avalanche breakdown resistance is increased merely by providing the pn diode structures 28 in the peripheral breakdown-resistant structure area 25.

Figure 24:
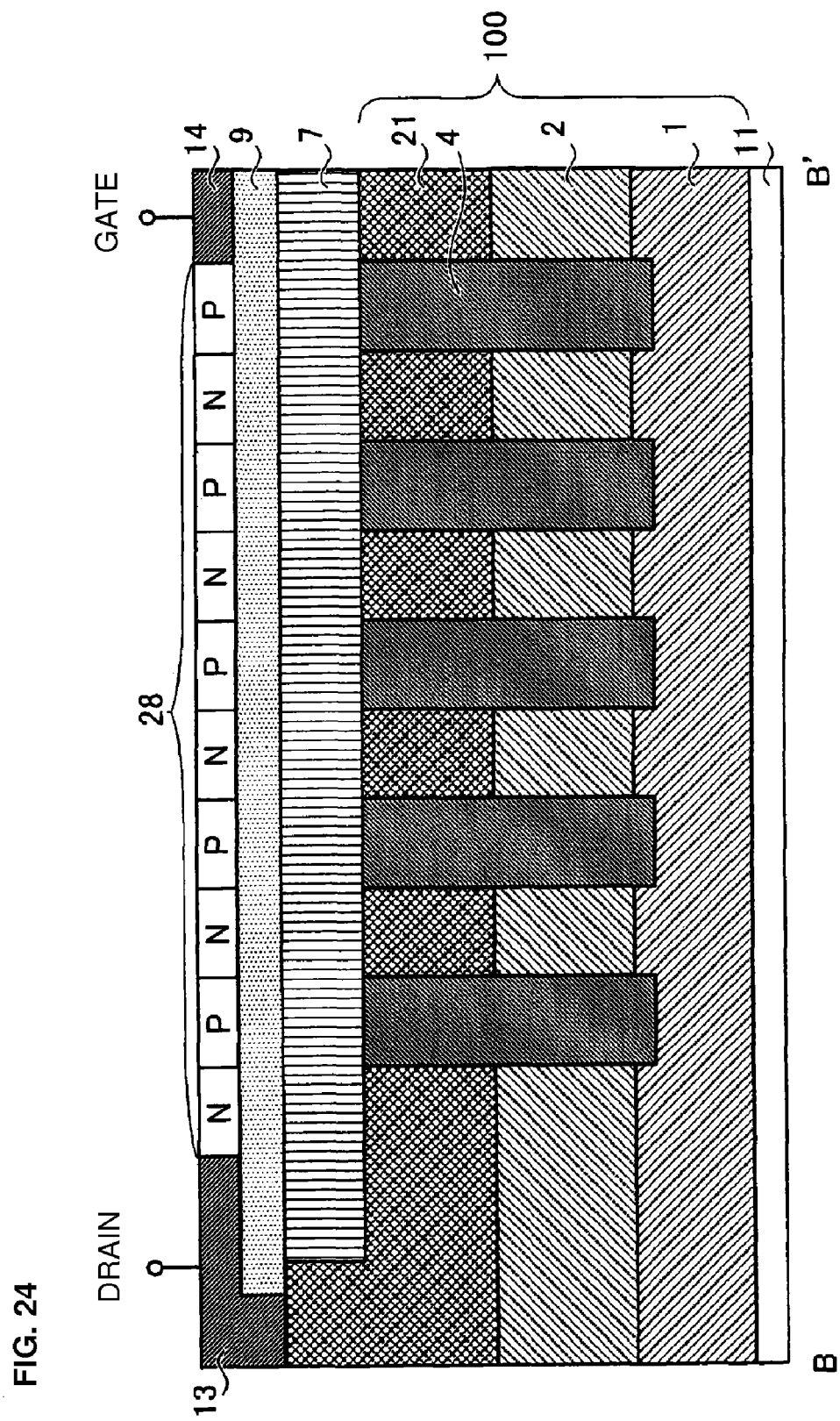
FIG. 24 is a sectional view showing the structure of an important part of a semiconductor device according to a fourth embodiment.
Figure 25:
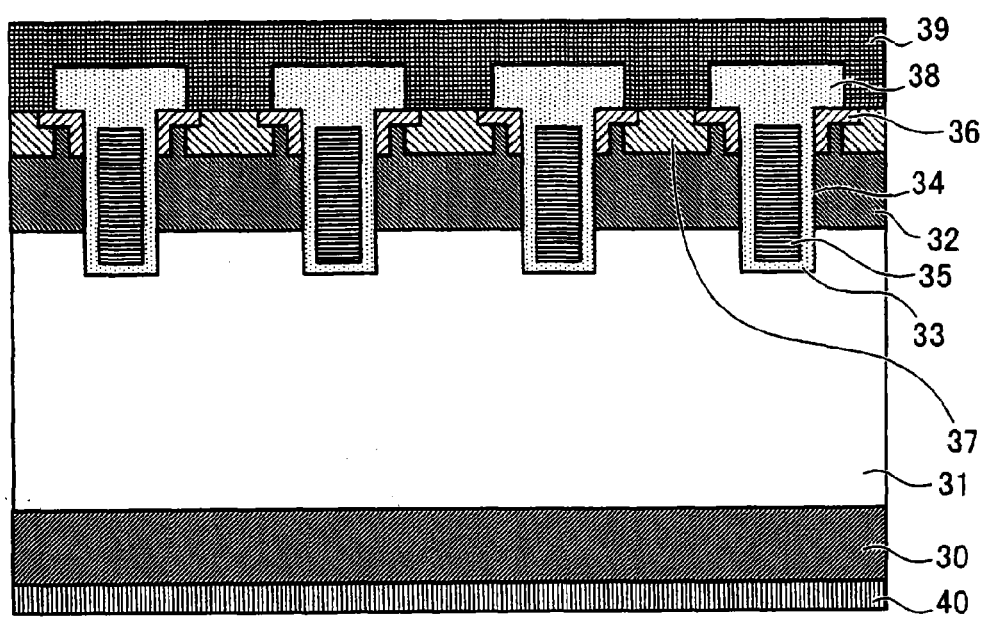
FIG. 25 is a sectional view showing the structure of a conventional vertical MOS device.
Figure 26:
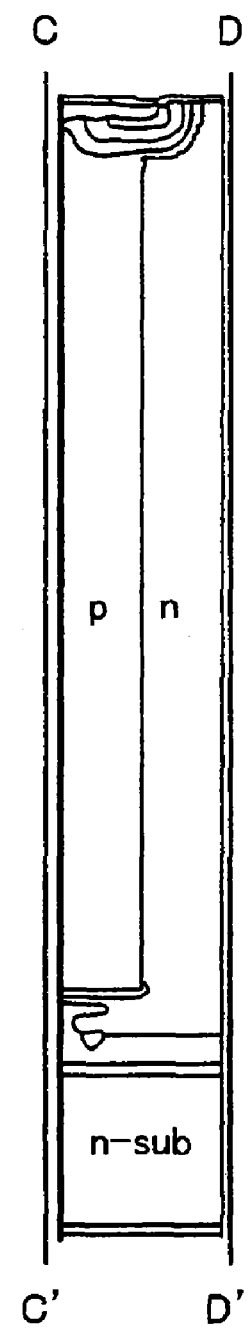
FIG. 26 is a sectional view showing the structure of a conventional super-junction substrate.
Figure 27:
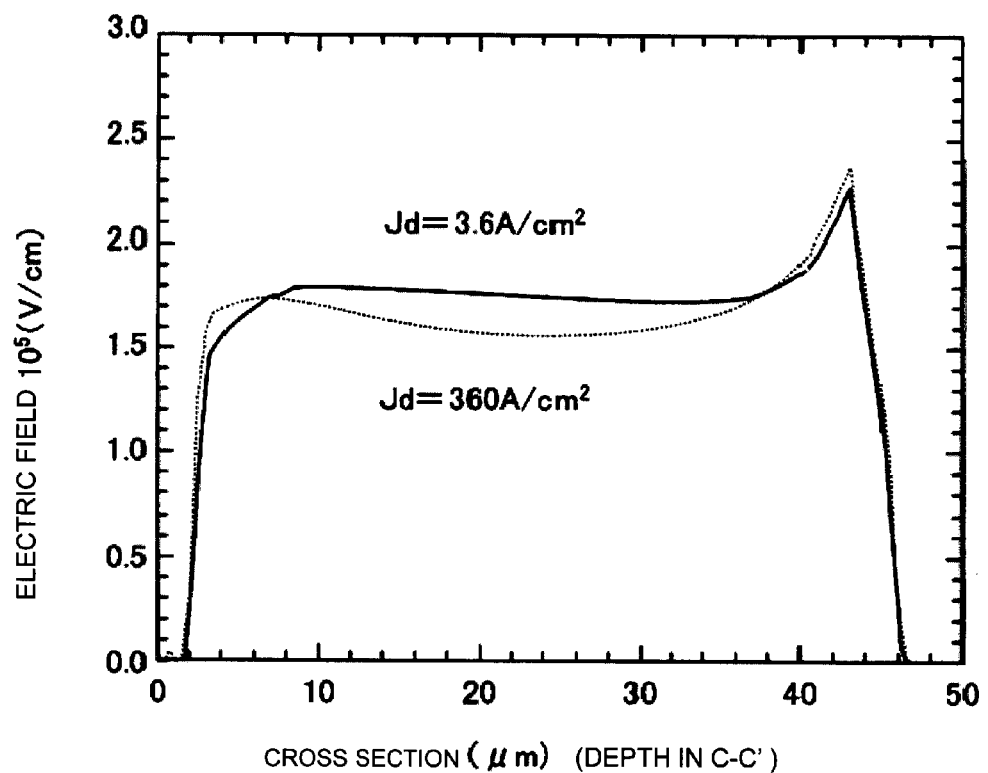
FIG. 27 is a graph showing an electric field profile along a cutting line C-C' in FIG. 26.

Next, a semiconductor device according to a fourth embodiment will be described. FIG. 24 is a sectional view showing the structure of an important part of a semiconductor device according to the forth embodiment. The semiconductor device according to the forth embodiment is different from that according to the third embodiment in that each polysilicon pn diode structure 28 is formed between a gate electrode 14 and a drain electrode 13 in a peripheral breakdown-resistant structure area 25. The gate electrode 14 is electrically connected to gate electrodes 5 in an active area 24. The anode of each pn diode structure 28 is located on the gate side and its cathode is located on the drain side.

The device breakdown voltage of the semiconductor device according to the fourth embodiment is 758 V, and the device is not broken until the drain current reaches 650 A/cm². As for the L-load turn-off waveform, the device can be turned off at a large current of 485 A/cm² without being broken. Almost the same characteristics as described above are obtained even in the case where in the semiconductor device according to the fourth embodiment the trench gate structure is replaced by a planar gate structure. In this case, the device breakdown voltage is 779 V and the device is not broken until the drain current reaches 653 A/cm². As for the L-load turn-off waveform, the device can be turned off at a large current of 499 A/cm² without being broken.

In the semiconductor device according to the fourth embodiment, when a high voltage is applied between the source and the drain, avalanche current flows through the gate electrode, whereby the gate voltage increases and the MOSFET is turned on temporarily. The MOSFET is rendered conductive to consume avalanche energy. The device is thus prevented from being destroyed.

As described above, the semiconductor device according to the invention is useful for the vertical semiconductor device using the super-junction semiconductor substrate and particularly is suitable for the semiconductor device such as MOSFET.

The invention has been described with reference to certain preferred embodiments thereof. It will be understood, however, that modifications and variations are possible within the scope of the appended claims.

This application is based on, and claims priority to, Japanese Patent Application No: 2007-254636, filed on Sep. 28, 2007. The disclosure of the priority application, in its entirety, including the drawings, claims, and the specification thereof, is incorporated herein by reference.

What is claimed is:

1. A semiconductor device comprising:
   a high-impurity-concentration semiconductor substrate of a first conductivity type;
   a parallel pn structure formed on the semiconductor substrate and in which regions of the first conductivity type and regions of a second conductivity type are arranged alternately and joined to each other;
   a channel region of the second conductivity type formed on part of a surface of the parallel pn structure;
   source regions of the first conductivity type which occupy surface portions of the channel region;
   trenches which are adjacent to the source regions and penetrate through the channel region so as to reach the parallel pn structure;
   gate electrodes formed on surfaces of the trenches with gate oxide films interposed in between;
   an insulating layer formed on surfaces of the gate electrodes;
   a source electrode formed on part of a surface of the insulating layer and is in contact with surfaces of the channel region and the source regions;
   a drain electrode formed on part of the surface of the insulating layer and a surface of the regions of the first conductivity type of the parallel pn structure; and
   a diode formed on part of the surface of the insulating film in such a manner that it is in contact with the source electrode and the drain electrode and that its anode is located on the side of the source electrode and its cathode is located on the side of the drain electrode, and which is low in breakdown voltage than an active area.

2. The semiconductor device according to claim 1, wherein the parallel pn structure is striped by the regions of the first conductivity type and the regions of the second conductivity type.

3. A semiconductor device comprising:
   a high-impurity-concentration semiconductor substrate of a first conductivity type;
   a parallel pn structure formed on the semiconductor substrate and in which regions of the first conductivity type and regions of a second conductivity type are arranged alternately and joined to each other;
   a channel region of the second conductivity type formed on part of a surface of the parallel pn structure;
   a source region of the first conductivity type which occupies a surface portion of the channel region;
   a gate electrode formed on a surface of the parallel pn structure with a gate oxide film interposed in between so as to be in contact with the source region and the channel region;
   an insulating layer formed on a surface of the gate electrode;
   a source electrode formed on part of a surface of the insulating layer and is in contact with surfaces of the channel region and the source region;
   a drain electrode formed on part of the surface of the insulating layer and a surface of the regions of the first conductivity type of the parallel pn structure; and
   a diode formed on part of the surface of the insulating film in such a manner that it is in contact with the source electrode and the drain electrode and that its anode is located on the side of the source electrode and its cathode is located on the side of the drain electrode, and which is low in breakdown voltage than an active area.

4. The semiconductor device according to claim 3, wherein the parallel pn structure is striped by the regions of the first conductivity type and the regions of the second conductivity type.

* * * * *